United States Patent
Izumi

(10) Patent No.: US 8,509,975 B2
(45) Date of Patent: Aug. 13, 2013

(54) VEHICLE, METHOD OF ESTIMATING STATE OF CHARGE OF SECONDARY BATTERY, AND METHOD OF CONTROLLING VEHICLE

(75) Inventor: Junta Izumi, Nagoya (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 322 days.

(21) Appl. No.: 12/864,577

(22) PCT Filed: Oct. 17, 2008

(86) PCT No.: PCT/JP2008/068837
§ 371 (c)(1),
(2), (4) Date: Jul. 26, 2010

(87) PCT Pub. No.: WO2009/104305
PCT Pub. Date: Aug. 27, 2009

(65) Prior Publication Data
US 2010/0318252 A1     Dec. 16, 2010

(30) Foreign Application Priority Data

Feb. 19, 2008  (JP) ................................. 2008-037757

(51) Int. Cl.
*G06F 19/00* (2011.01)
*G01R 19/00* (2006.01)
*H02J 7/00* (2006.01)
*H02J 7/04* (2006.01)

(52) U.S. Cl.
USPC ................ 701/22; 320/150; 320/161; 702/63

(58) Field of Classification Search
None
See application file for complete search history.

(56) References Cited

U.S. PATENT DOCUMENTS

| 5,555,737 A | * | 9/1996 | Takeo et al. ...................... 62/230 |
| 6,285,163 B1 | | 9/2001 | Watanabe et al. |

(Continued)

FOREIGN PATENT DOCUMENTS

| CN | 1311860 A | 9/2001 |
| CN | 101025104 A | 8/2007 |

(Continued)

OTHER PUBLICATIONS

International Search Report issued in International Application No. PCT/JP2008/068837 on Jan. 6, 2009 (with translation).

(Continued)

*Primary Examiner* — James Trammell
*Assistant Examiner* — Demetra Smith-Stewart
(74) *Attorney, Agent, or Firm* — Oliff & Berridge, PLC

(57) ABSTRACT

A vehicle comprising a chargeable/dischargeable battery, a current sensor for detecting the current from the battery, and a control unit for estimating the charged state of the battery and controlling the charging/discharging of the battery according to the charged state. In a first operation mode in which charging and discharging cycles are repeated, the control unit estimates the open-circuit voltage of the battery, and determines the charged state on the basis of the value which is obtained by correcting the open-circuit voltage according to the polarization. In a second operation mode in which either one of charging and discharging is continued, the control unit determines the charged state on the basis of the result of integration of the current detected by the current sensor. Hence, the charged and discharged amperehours are large, thereby providing a vehicle which can effectively utilize the secondary battery.

6 Claims, 5 Drawing Sheets

(56) References Cited

U.S. PATENT DOCUMENTS

| | | | | |
|---|---|---|---|---|
| 8,102,146 B2* | 1/2012 | Suzuki | | 320/107 |
| 2006/0276981 A1* | 12/2006 | Aridome | | 702/64 |
| 2007/0152640 A1* | 7/2007 | Sasaki et al. | | 320/150 |
| 2008/0303529 A1* | 12/2008 | Nakamura et al. | | 324/433 |
| 2010/0045239 A1 | 2/2010 | Oki | | |
| 2010/0318250 A1* | 12/2010 | Mitsutani | | 701/22 |

FOREIGN PATENT DOCUMENTS

| | | |
|---|---|---|
| JP | A-8-19114 | 1/1996 |
| JP | A-10-56741 | 2/1998 |
| JP | A-11-206028 | 7/1999 |
| JP | B2-3016349 | 3/2000 |
| JP | A-2001-63347 | 3/2001 |
| JP | A-2001-91604 | 4/2001 |
| JP | A-2003-7353 | 1/2003 |
| JP | A-2005-312224 | 11/2005 |
| JP | B2-3873623 | 11/2006 |
| JP | A-2007-195336 | 8/2007 |
| JP | A-2007-212298 | 8/2007 |
| JP | A-2008-220080 | 9/2008 |
| WO | WO98/56059 A1 | 12/1998 |
| WO | WO99/61929 A1 | 12/1999 |

OTHER PUBLICATIONS

Japanese Office Action issued in Japanese Patent Application No. 2008-037757 on Jan. 5, 2011 (with translation).

* cited by examiner

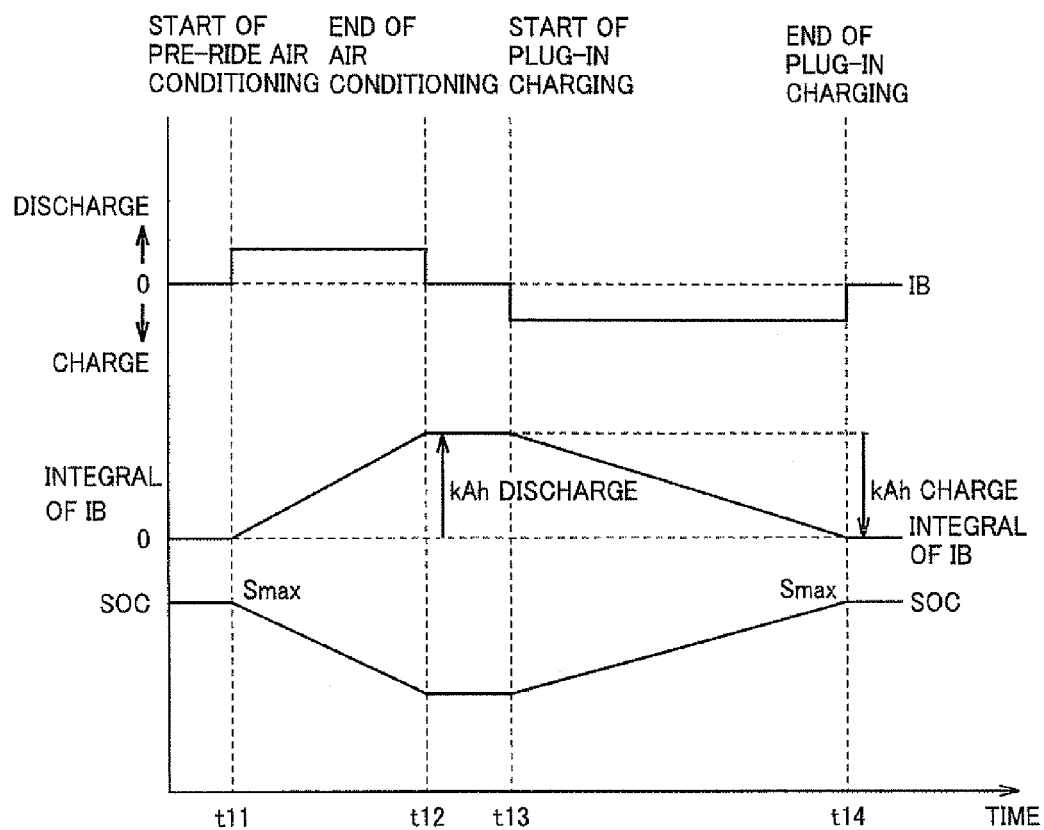

VEHICLE, METHOD OF ESTIMATING STATE OF CHARGE OF SECONDARY BATTERY, AND METHOD OF CONTROLLING VEHICLE

TECHNICAL FIELD

The present invention relates to a vehicle and a method of estimating a state of charge of a secondary battery, and particularly to a vehicle having a secondary battery and a controller for controlling charging and discharging of the secondary battery, as well as a method of estimating a state of charge of the secondary battery.

BACKGROUND ART

Recently, environmentally-friendly vehicles such as an electric vehicle using a motor for driving wheels and a hybrid vehicle using a motor and an engine in combination for driving wheels have been of interest. Regarding such a hybrid vehicle, an electric generator mounted on the vehicle is rotated by motive power of the engine, and the generated electric power is used for charging a battery and is also supplied to the motor. Besides these vehicles, a vehicle having an externally chargeable battery that can be charged at home for example (hereinafter simply referred to as external charging) is also under study.

An externally chargeable vehicle may be charged at home for example, and accordingly the frequency at which the vehicle is driven to a service station for fuel replenishment is reduced, which is convenient for drivers. Moreover, electricity at a lower night rate or the like may be used to make the cost reasonable.

Japanese Patent Publication No. 3016349 (Patent Document 1) discloses such an externally chargeable hybrid vehicle.

Patent Document 1: Japanese Patent Publication No. 3016349
Patent Document 2: WO99/61929
Patent Document 3: Japanese Patent Laying-Open No. 2003-7353
Patent Document 4: WO98/56059

DISCLOSURE OF THE INVENTION

Problems to be Solved by the Invention

Battery-mounted vehicles such as hybrid vehicle and electric vehicle are controlled in such a manner that the state of charge (SOC) of the battery is calculated to prevent the battery from being overcharged or overdischarged. The SOC may also be referred to as amount of stored energy, remaining capacity or the like.

For example, International Patent Publication No. WO99/61929 (Patent Document 2) discloses an example of the battery SOC estimation method. The disclosed SOC estimation method takes internal resistance and polarization of the battery into account so that the SOC can be estimated accurately even when the battery is alternately and repeatedly charged and discharged in short cycles.

When the battery is externally charged, the battery is not discharged and therefore is only charged continuously. If such a conventional SOC estimation method is also applied to a battery which is being externally charged, the estimated SOC is somewhat higher than the actual SOC, because the battery voltage changes to a greater extent due to the polarization. Then, a controller recognizes that an upper control limit of the SOC is reached, earlier than when the upper control limit is actually reached, while the battery is externally charged. The controller thus inappropriately stops the battery from being externally charged.

It is desirable for an externally chargeable vehicle to use electric power stored by external charging in the battery to travel in an EV (Electric Vehicle) mode without using the engine, so as not to use fuel such as gasoline to a possible extent. The fact that the battery cannot be externally charged exactly to the upper limit of the SOC is disadvantageous, because the distance over which the vehicle can travel in the EV mode is shortened.

On the contrary, the battery may be only discharged continuously in such a case where a timer function or the like is used to air-condition the vehicle with electric power of the battery, before a driver gets in the vehicle in a bitterly cold morning for example. In such a case, the SOC estimated by the conventional SOC estimation method is somewhat lower than the actual SOC. Then, the controller may erroneously recognize that the SOC has reached a lower control limit and then stop air conditioning earlier than appropriate.

An object of the present invention is to provide a vehicle in which a secondary battery can be charged with or discharge a large amount of electric energy and can be used effectively.

Means for Solving the Problems

In summary, the present invention is a vehicle including a chargeable and dischargeable secondary battery, a current sensor for detecting electric current of the secondary battery, and a controller for estimating a state of charge of the secondary battery and controlling charging and discharging of the secondary battery based on the state of charge. In a first operation mode in which a charging cycle and a discharging cycle are repeated, the controller estimates an open-circuit voltage of the secondary battery and determines the state of charge based on a value obtained by correcting the open-circuit voltage based on polarization. In a second operation mode in which one of charging and discharging is continued, the controller determines the state of charge based on a result of integration of the electric current detected by the current sensor.

Preferably, the vehicle is configured to be able to perform external charging by which the secondary battery is charged from a source external to the vehicle. The second operation mode is selected when the external charging is performed.

More preferably, the vehicle further includes an air conditioning apparatus capable of executing pre-ride air conditioning using electric power supplied from the secondary battery. The second operation mode is selected when the external charging is performed and when the pre-ride air conditioning is performed. When one of the external charging and the pre-ride air conditioning is executed as a preprocess and the other of the external charging and the pre-ride air conditioning is executed as a post-process performed subsequently to the preprocess, the controller stores an offset value of the current sensor before the preprocess is executed and, when the post-process is executed, the controller uses the offset value stored before the preprocess is executed, to correct the electric current detected by the current sensor.

Preferably, the vehicle further includes an electric motor capable of executing a power-running operation and a regenerative operation. The first operation mode is selected when the vehicle travels in such a manner that the power-running operation and the regenerative operation can be repeated.

According to another aspect, the present invention is a method of estimating a state of charge of a secondary battery that is chargeable and dischargeable. The method includes the steps of: determining an operation mode in which the secondary battery is used; estimating an open-circuit voltage of the secondary battery and determining the state of charge based on a value obtained by correcting the open-circuit voltage based on polarization, when the step of determining an operation mode determines that the operation mode is a first operation mode in which a charging cycle and a discharging cycle are repeated; and determining the state of charge based on a result of integration of the electric current detected by the current sensor, when the step of determining an operation mode determines that the operation mode is a second operation mode in which one of charging and discharging is continued.

Preferably, the secondary battery is mounted on a vehicle. The vehicle is configured to be able to perform external charging by which the secondary battery is charged from a source external to the vehicle. The step of determining an operation mode determines that the operation mode is the second operation mode when the external charging is performed.

More preferably, the vehicle further includes an air conditioning apparatus capable of executing pre-ride air conditioning using electric power supplied from the secondary battery. The second operation mode is selected when the external charging is performed and when the pre-ride air conditioning is performed. The method further includes the step of storing, when one of the external charging and the pre-ride air conditioning is executed as a preprocess and the other of the external charging and the pre-ride air conditioning is executed as a post-process performed subsequently to the preprocess, an offset value of the current sensor before the preprocess is executed and, when the post-process is executed, using the offset value stored before the preprocess is executed, to correct the electric current detected by the current sensor.

Preferably, the vehicle further includes an electric motor capable of executing a power-running operation and a regenerative operation. The step of determining an operation mode determines that the operation mode is the first operation mode when the vehicle is traveling in such a manner that the power-running operation and the regenerative operation can be repeated.

Effects of the Invention

The present invention can increase an amount of energy with which the battery is charged and an amount of energy discharged from the battery. Therefore, the battery can be effectively used, and the distance over which a vehicle travels with the motor without using the engine can be extended.

BRIEF DESCRIPTION OF THE DRAWINGS

FIG. 6 is a waveform diagram for illustrating an example of the case where plug-in-charging is performed immediately after pre-ride air conditioning, based on an SOC calculation process in the present embodiment.

Figure 1:
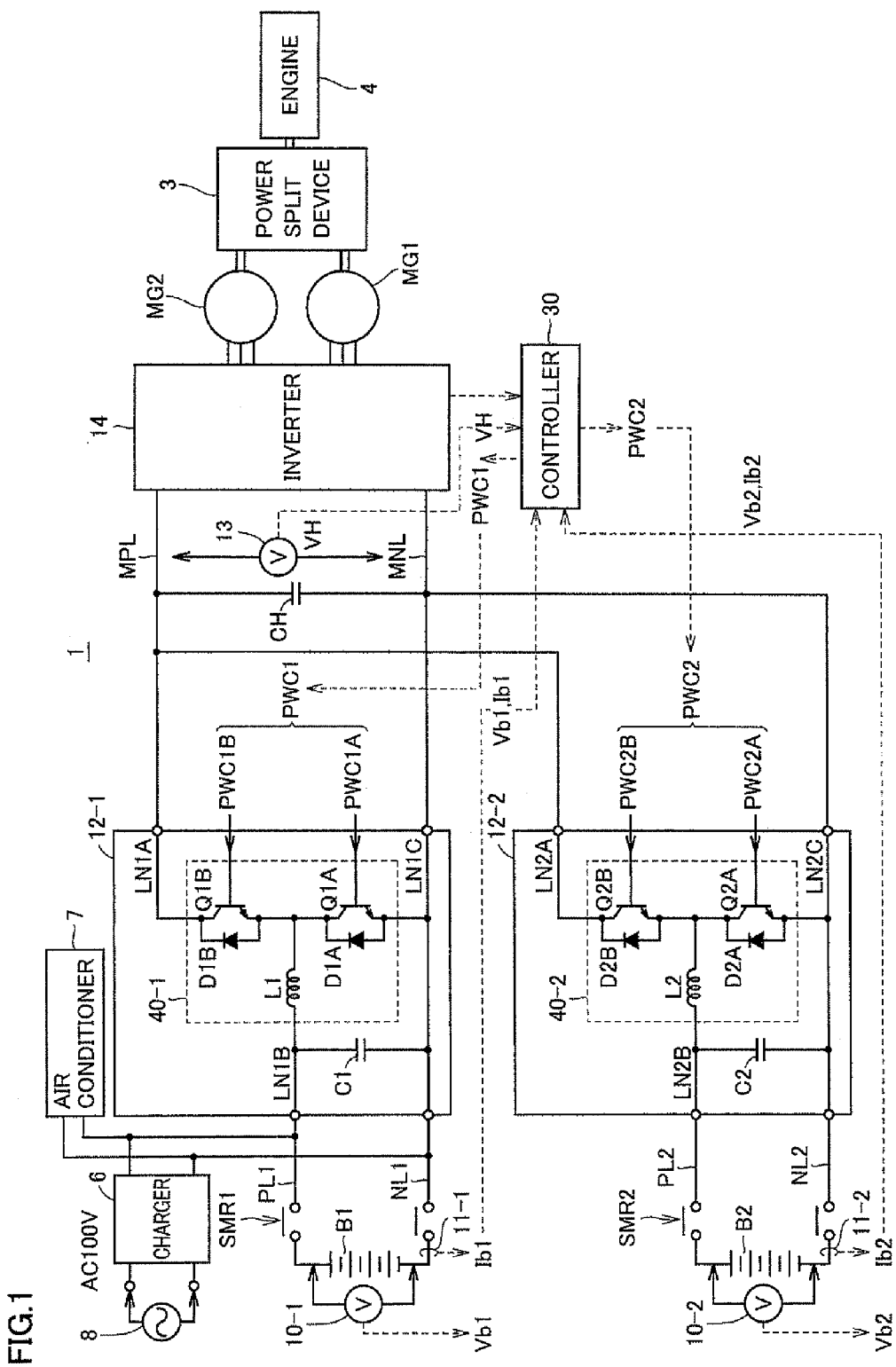
FIG. 1 is a diagram showing a main configuration of a vehicle 1 according to an embodiment of the present invention.

DESCRIPTION OF THE REFERENCE SIGNS 1 vehicle; 3 power split device; 4 engine; 6 charger; 7 air conditioner; 8 commercial power supply; 10-1, 10-2, 13 voltage sensor; 11-1, 11-2 current sensor; 12-1, 12-2 voltage step-up converter; 14 inverter; 30 controller; 40-1, 40-2 chopper circuit; 110 current detection unit; 112 voltage detection unit; 114 pseudo SOC estimation unit; 116 electromotive force estimation unit; 118 voltage variation estimation unit; 120 dynamic voltage variation estimation unit; 122, 128 adder; 124 comparator; 126 SOC correction amount calculation unit; 132 initial SOC detection unit; 134 current integrator; 136 selection unit; B1, B2 battery; C1, C2, CH smoothing capacitor; D1A, D1B, D2A, D2B diode; L1, L2 inductor; LN1A, LN2A positive bus; LN1B, LN2B line; LN1C, LN2C negative bus; MA, MB battery model; MG1, MG2 motor generator; MNL main negative line; MPL main positive line; NL1, NL2 negative line; PL1, PL2 positive line; Q1A, Q1B, Q2A, Q2B transistor; SMR1, SMR2 system main relay

BEST MODES FOR CARRYING OUT THE INVENTION

Embodiments of the present invention will hereinafter be described in detail with reference to the drawings. In the drawings, like or corresponding components are denoted by like reference characters, and a description thereof will not be repeated.

Entire Configuration of Vehicle

FIG. 1 shows a main configuration of a vehicle 1 according to an embodiment of the present invention.

Referring to FIG. 1, vehicle 1 includes batteries B1, B2, voltage step-up converters 12-1, 12-2, a smoothing capacitor CH, voltage sensors 10-1, 10-2, 13, an inverter 14, an engine 4, motor generators MG1, MG2, a power split device 3, and a controller 30.

Batteries B1, B2 mounted on this vehicle are externally chargeable. Therefore, vehicle 1 further includes a charger 6 that has a connector connectable to a commercial power supply 8 of AC 100 V or 200 V for example, and is connected to a positive line PL1 and a negative line NL1. Charger 6 converts AC (alternating current) into DC (direct current), and regulates and provides the voltage to a battery. In order that batteries can be externally charged, a different system may be used such as the system of connecting neutral points of stator coils of motor generators MG1, MG2 to an AC power supply, or the system of allowing voltage step-up converters 12-1, 12-2 to function together as an AC to DC converter.

Smoothing capacitor CH smoothes a voltage stepped up by voltage step-up converters 12-1, 12-2. Voltage sensor 13 detects a voltage VH between the terminals of smoothing capacitor CH and outputs the detected voltage to controller 30.

Inverter 14 converts DC voltage VH provided from voltage step-up converter 12-1 or 12-2 into a three-phase AC voltage and outputs the AC voltage to motor generators MG1 and MG2.

Power split device 3 is coupled to engine 4 and motor generators MG1, MG2 for distributing motive power between them. As power split device 3, for example, a planetary gear train having three rotational shafts for a sun gear, a planetary carrier, and a ring gear may be used. In the planetary gear train, when rotations of two of the three rotational shafts are determined, the rotation of the remaining one rotational shaft is inevitably determined. These three rotational shafts are connected respectively to respective rotational shafts of engine 4 and motor generators MG1, MG2. The rotational shaft of motor generator MG2 is coupled to wheels by a reduction gear and a differential gear (not shown). A reducer for the rotational shaft of motor generator MG2 may further be incorporated in power split device 3.

Battery B1 has its positive electrode connected to positive line PL1 and its negative electrode connected to negative line NL1. Voltage sensor 10-1 measures a voltage Vb1 between the positive and negative electrodes of battery B1. In order to monitor a state of charge SOC1 of battery B1 together with voltage sensor 10-1, current sensor 11-1 for detecting a current Ib1 flowing in battery B1 is provided. State of charge SOC1 of battery B1 is detected by controller 30. Controller 30 calculates state of charge SOC1 using a method explained later in connection with FIGS. 4 and 5.

Battery B2 has its positive electrode connected to a positive line PL2 and its negative electrode connected to a negative line NL2. Voltage sensor 10-2 measures a voltage Vb2 between the terminals of battery B2. In order to monitor a state of charge SOC2 of battery 132 together with voltage sensor 10-2, current sensor 11-2 for detecting a current Ib2 flowing in battery B2 is provided. State of charge SOC2 of battery 132 is detected by controller 30. Controller 30 calculates state of charge SOC2 using a method explained later in connection with FIGS. 4 and 5.

As batteries B1, B2, for example, secondary batteries such as lead-acid battery, nickel-metal hydride battery, lithium-ion battery, or large-capacity capacitors such as electric double-layer capacitor may be used.

The maximum capacity of battery B2 and battery B1 each is set so that batteries B2 and B1 used simultaneously for example can output maximum power that is tolerable to electrical loads (inverter 14 and motor generator MG2) connected between a main positive line MPL and a main negative line MNL. In this way, the vehicle can use the maximum power for traveling in the EV (Electric Vehicle) mode without using the engine.

When electric power of battery B2 has been consumed completely, engine 4 may be used in addition to battery B1 so that the vehicle can travel with the maximum power even without using battery B2. The vehicle may be configured to be mounted with a plurality of batteries B2, and connection to a first battery with its electric power consumed may be changed to connection to second and third batteries by means of a switch or the like, so that the vehicle can continue traveling in the EV mode.

Inverter 14 is connected to main positive line MPL and main negative line MNL. Inverter 14 receives a stepped-up voltage from voltage step-up converters 12-1 and 12-2 and drives motor generator MG1 for starting engine 4 for example. Inverter 14 also returns electric power that is generated by motor generator MG1 from the motive power transmitted from engine 4, to voltage step-up converters 12-1 and 12-2. At this time, voltage step-up converters 12-1 and 12-2 are controlled by controller 30 so that the converters operate respectively as voltage conversion circuits for converting voltage VH into voltages Vb1, Vb2, respectively.

Inverter 14 converts a DC voltage that is output from voltage step-up converters 12-1 and 12-2 into a three-phase AC voltage and outputs the voltage to motor generator MG2 that drives wheels. In regenerative braking, inverter 14 returns electric power generated by motor generator MG2 back to voltage step-up converters 12-1 and 12-2. At this time, voltage step-up converters 12-1 and 12-2 are controlled by controller 30 so that the converters operate respectively as voltage conversion circuits for converting voltage VH into voltages Vb1, Vb2, respectively.

Controller 30 receives a torque command value, a motor current value, and a rotational speed of motor generators MG1, MG2 each, respective values of voltages Vb1, Vb2, VH, and a start signal. Controller 30 outputs a voltage step-up instruction, a voltage step-down instruction, and an instruction to inhibit operation to voltage step-up converters 12-1, 12-2.

Further, controller 30 outputs, to inverter 14, a drive instruction for converting DC voltage VH output from voltage step-up converters 12-1, 12-2 into an AC voltage for driving motor generator MG1, and a regenerative instruction for converting an AC voltage generated by motor generator MG1 into DC voltage Vh and returning the voltage back to voltage step-up converters 12-1, 12-2.

Likewise, controller 30 outputs, to inverter 14, a drive instruction for converting a DC voltage into an AC voltage for driving motor generator MG2, and a regenerative instruction for converting an AC voltage generated by motor generator MG2 into a DC voltage and returning the voltage back to voltage step-up converters 12-1, 12-2.

Voltage step-up converter 12-1 includes a chopper circuit 40-1, a positive bus LN1A, a negative bus LN1C, a line LN1B, and a smoothing capacitor C1. Chopper circuit 40-1 includes transistors Q1A, Q1B, diodes D1A, D1B, and an inductor L1. Transistor Q1B and diode D1B constitute an upper arm. Transistor Q1A and diode D1A constitute a lower arm.

Positive bus LN1A has one end connected to the collector of transistor Q1B and the other end connected to main positive line MPL. Negative bus LN1C has one end connected to negative line NL1 and the other end connected to main negative line MNL.

Transistors Q1A, Q1B are connected in series between negative bus LN1C and positive bus LN1A. Specifically, the emitter of transistor Q1A is connected to negative bus LN1C, and the emitter of transistor Q1B is connected to the collector of transistor Q1A, and the collector of transistor Q1B is connected to positive bus LN1A. In the lower arm, diode D1A is connected in parallel with transistor Q1A. In the upper arm, diode D1B is connected in parallel with transistor Q1B. The forward direction of diode D1A is the direction from bus LN1C toward inductor L1. The forward direction of diode D1B is the direction from inductor L1 toward bus LN1A. One end of inductor L1 is connected to a connection node between transistors Q1A and Q1B.

Line LN1B is connected between positive line PL1 and the other end of inductor L1. Smoothing capacitor C1 is connected between line LN1B and negative bus LN1C and reduces an AC component included in a DC voltage between line LN1B and negative bus LN1C.

Positive line PL1 and negative line NL1 are connected by system main relay SMR1 to the positive electrode and the negative electrode of battery B1, respectively.

In response to drive signal PWC1 provided from controller 30, chopper circuit 40-1 steps up DC power (drive electric power) received from positive line PL1 and negative line NL1, and supplies the resultant voltage to main positive line MPL and main negative line MNL. Chopper circuit 40-1 can also step down the voltage of main positive line MPL and main negative line MNL and supply the resultant voltage to battery B1.

Voltage step-up converter 12-2 includes a chopper circuit 40-2, a positive bus LN2A, a negative bus LN2C, a line LN2B, and a smoothing capacitor C2. Chopper circuit 40-2 includes transistors Q2A, Q2B, diodes D2A, D2B, and an inductor L2. Transistors Q2B and diode D2B constitute an upper arm. Transistor Q2A and diode D2A constitute a lower arm.

Positive bus LN2A has one end connected to the collector of transistor Q2B and the other end connected to main positive line MPL. Negative bus LN2C has one end connected to negative line NL2 and the other end connected to main negative line MNL.

Transistors Q2A, Q2B are connected in series between negative bus LN2C and positive bus LN2A. Specifically, the emitter of transistor Q2A is connected to negative bus LN2C, the emitter of transistor Q2B is connected to the collector of transistor Q2A, and the collector of transistor Q2B is connected to positive bus LN2A. In the lower arm, diode D2A is connected in parallel with transistor Q2A. In the upper arm, diode D2B is connected in parallel with transistor Q2B. The forward direction of diode D2A is the direction from bus LN2C toward inductor L2. The forward direction of diode D2B is the direction from inductor L2 toward bus LN2A. Inductor L2 is connected to a connection node between transistors Q2A and Q2B.

Transistors Q1B, Q1A, Q2A, Q2B may be any as long as they are power switching devices, and IGBT (Insulated Gate Bipolar Transistor), power MOSFET (Metal-Oxide Semiconductor Field-Effect Transistor) or the like may be used.

Line LN2B has one end connected to positive line PL2 and the other end connected to inductor L2. Smoothing capacitor C2 is connected between line LN2B and negative bus LN2C and reduces an AC component included in a DC voltage between line LN2B and negative bus LN2C.

Positive line PL2 and negative line NL2 are connected by system main relay SMR2 to the positive electrode and the negative electrode of battery B2, respectively.

In response to drive signal PWC2 provided from controller 30 in FIG. 1, chopper circuit 40-2 steps up DC power (drive electric power) received from positive line PL2 and negative line NL2, and supplies the resultant voltage to main positive line MPL and main negative line MNL. Chopper circuit 40-2 can also step down a voltage of main positive line MPL and main negative line MNL and supply the resultant voltage to battery B2.

Description of Open-Circuit Voltage and State of Charge

Figure 2:
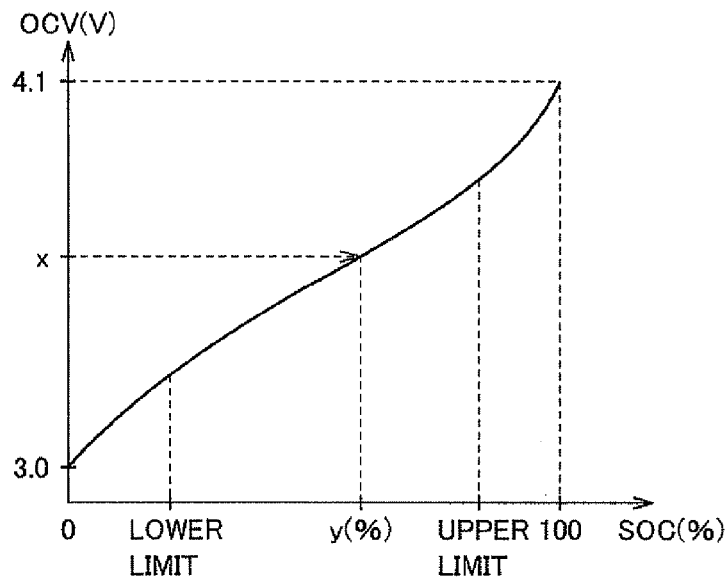
FIG. 2 is a diagram showing a relation between an open-circuit voltage OCV and an SOC of a battery.

FIG. 2 is a diagram showing a relation between an open-circuit voltage (OCV) and an SOC of a battery.

The OCV of the battery has a correlation with the SOC. Namely, the OCV increases as the SOC increases. For example, regarding a lithium-ion battery, between OCV=3.0 V for SOC=0% and OCV=4.1 V for SOC=100%, the OCV and the SOC have a correlation as shown in FIG. 2. This correlation is measured in advance and stored in the form of a map. Then, the OCV is measured by a voltage sensor, and the SOC can be estimated with reference to the map based on the OCV.

While the vehicle is traveling or being externally charged, however, current has to be flown in the circuit and therefore the open-circuit voltage cannot be measured. While current is flown in the circuit, the battery voltage is influenced by an increase/decrease in voltage due to the internal resistance and an increase/decrease in voltage due to the polarization.

Figure 3:
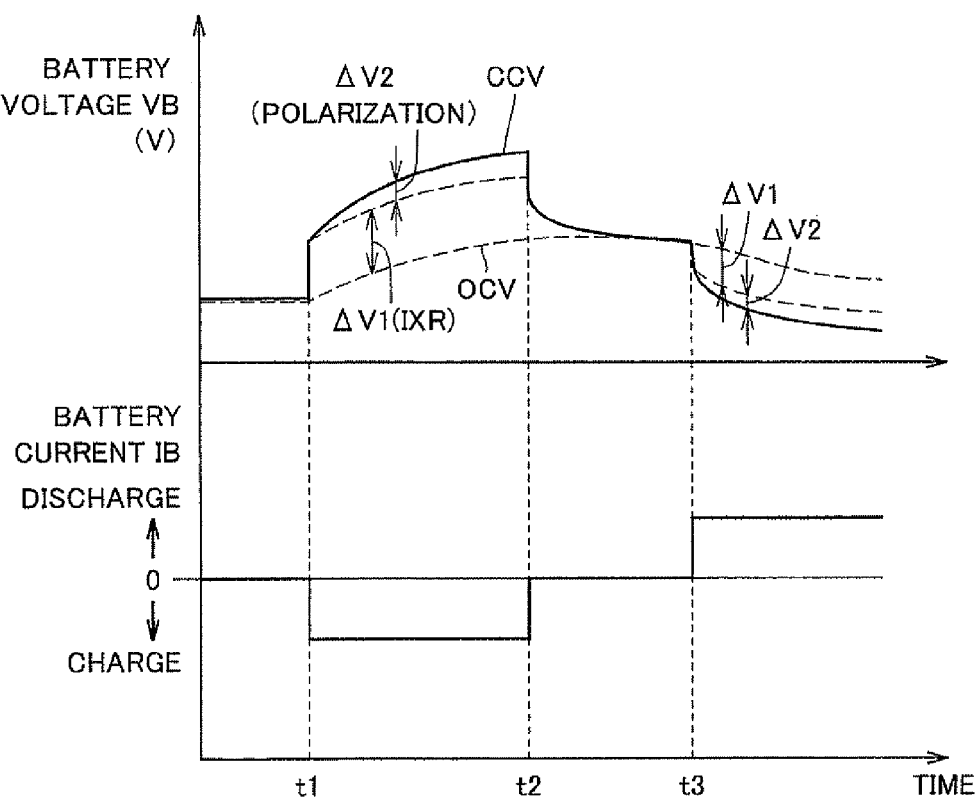
FIG. 3 is a waveform diagram for illustrating a change with time of a voltage of a battery being charged and a voltage of the battery being discharged.

FIG. 3 is a waveform diagram for illustrating a change with time of a voltage of a battery being charged and a voltage of the battery being discharged.

Referring to FIG. 3, a description will be given of the case where a battery is charged from time t1 to time t2, neither charged nor discharged from time t2 to time t3, and discharged from time t3.

At time t1, the battery starts being charged. As to battery current IB, the positive direction represents discharging and the negative direction represents charging. As charging proceeds, open-circuit voltage OCV increases as the state of charge SOC increases. While the battery is being charged, this open-circuit voltage OCV cannot be directly measured. It is a closed circuit voltage CCV that can be detected as battery voltage VB by a voltage sensor while the battery is being charged. Closed circuit voltage CCV corresponds to open-circuit voltage OCV to which a variation $\Delta V1$ due to the internal resistance of the battery and a variation $\Delta V2$ due to the polarization are added.

Variation $\Delta V1$ can be determined by calculating the product of charge current I and internal resistance R. Here, because internal resistance R of the battery has temperature dependency, the battery temperature may be measured to correct the internal resistance based on the temperature, and the corrected internal resistance may be used.

Variation $\Delta V2$ tends to increase as the charging time increases. Therefore, from time t1 to time t2, variation $\Delta V2$ gradually increases.

At time t2, charging is stopped. Then, variation $\Delta V1$ becomes zero because no current flows. Variation $\Delta V2$, however, does not immediately become zero, but approaches zero with the passage of time. Therefore, battery voltage VB has a higher value than open-circuit voltage OCV for some time and, when a certain time has elapsed, battery voltage VB becomes equal to open-circuit voltage OCV.

Regarding discharging from time t3, variations $\Delta V1$ and $\Delta V2$ appear in the opposite direction, namely in the direction of decreasing the measured voltage. The battery voltage while the battery is being discharged is similar to that while the battery is being charged in that $\Delta V1$ is the product of the internal resistance and the current and $\Delta V2$ is caused by the polarization and increases with time, and the description will not be repeated. When the battery is stopped from being discharged and the battery current becomes zero (not shown), the voltage increases by variation $\Delta V1$. Variation $\Delta V2$, however, does not immediately become zero. Therefore, a voltage somewhat lower than open-circuit voltage OCV is measured for some time. After this, when a certain time has elapsed, the measured voltage becomes equal to open-circuit voltage OCV.

As described above, voltage variation $\Delta V2$ due to the polarization changes depending on the time elapsed from the start of charging or discharging. Therefore, as described later in connection with a battery model MB in FIG. 5, in an SOC estimation process applied to a vehicle that is traveling, voltage variation $\Delta V2$ (Vdyn in FIG. 5) due to the polarization is determined according to a travel pattern in which a charging cycle and a discharging cycle in a regenerative mode and a power running mode are repeated, this voltage variation is used to estimate open-circuit voltage OCV from closed circuit voltage CCV and, based on the estimated open-circuit voltage OCV, the SOC is finally estimated.

In other words, voltage variation $\Delta V2$ (Vdyn in FIG. 5) is calculated based on a value adapted to a travel pattern in which charging and discharging are repeated.

SOC Estimation Process

Figure 4:
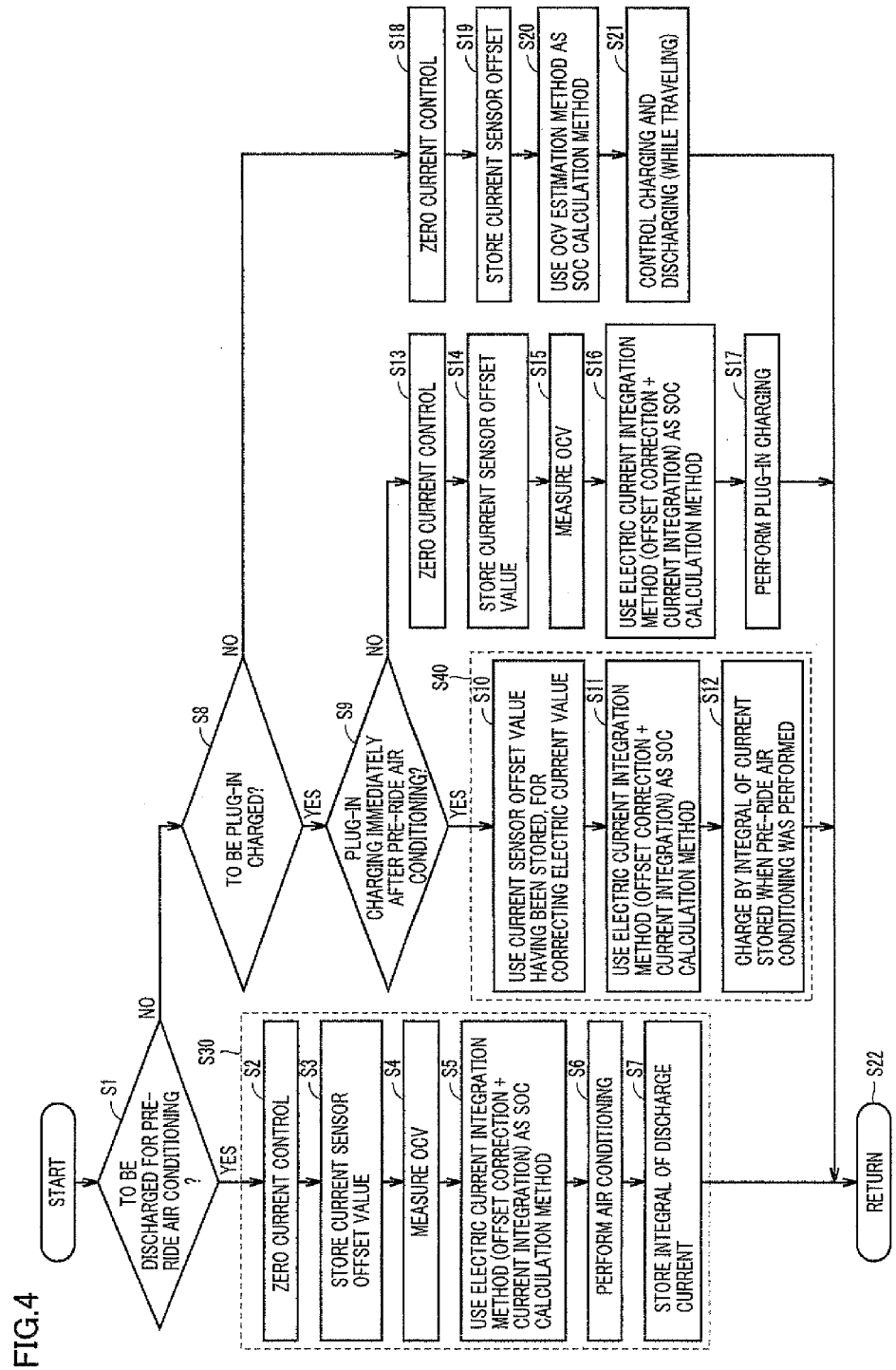
FIG. 4 is a flowchart illustrating an SOC estimation process and control of a vehicle performed in the present embodiment.

FIG. 4 is a flowchart illustrating an SOC estimation process and control of a vehicle performed in the present embodiment.

Referring to FIGS. 1 and 4, controller 30 determines in step S1 whether the vehicle is to be air-conditioned before a ride is taken in the vehicle (also referred to as pre-ride air conditioning) and the battery is to be charged.

Pre-ride air conditioning is a function that is performed, on the condition that a scheduled departure time is designated, to start air-conditioning the vehicle prior to the scheduled departure time, so that the vehicle interior temperature has been set at a comfortable temperature by heating or cooling at the scheduled departure time. Here, because the output of the battery is smaller at a lower temperature or higher temperature, pre-ride air conditioning may also be carried out depending on the case so that the battery performs as appropriate and as required. For such pre-ride air conditioning, an air conditioner is operated without starting the engine. Therefore, the battery is continuously discharged without being charged.

In step S1, based on an instruction of a driver/passenger of the vehicle, by a switch for example, it is determined whether pre-ride air conditioning is to be performed. When it is determined in step S1 that pre-ride air conditioning is to be performed (YES in step S1), a series of operations for pre-ride air conditioning is performed in step S30.

In step S30, zero current control in step S2 is performed first. An example will be described of the case where electric power of battery B1 is used to operate air conditioner 7. Controller 30 sets the circuit state by opening system main relay SMR1 so that battery current Ib1 is zero. In step S3, controller 30 stores a value detected by current sensor 11-1 as an offset value. This offset value is stored in a nonvolatile memory or the like in controller 30. For the zero current control, the system main relay may not necessarily be set off. Instead, the state of the peripheral circuit of the battery may be set so that no battery current flows, like the state where the operation of the voltage step-up converter is stopped and the operation of a load such as air conditioner is also stopped.

At this time, because the current is zero, open-circuit voltage OCV can be measured. Controller 30 therefore measures open-circuit voltage OCV by voltage sensor 10-1 in step S4. Then, based on open-circuit voltage OCV measured at this time, the map in which the correlation shown in FIG. 2 is stored is used to obtain the initial value of the state of charge SOC.

Subsequently, in step S5, controller 30 is configured to use an electric current integration method as a method of calculating the state of charge SOC. A value of electric current detected by the current sensor at this time is corrected by using the offset value stored in step S3 and is used for integration. After this, in the state where the SOC is calculated by this calculation method, air conditioning is executed in step S6.

Pre-ride air conditioning is automatically started when the time approaches the scheduled departure time, for example, ten minutes before the scheduled departure time. When a driver rides in the vehicle, pre-ride air conditioning is ended. Whether the driver rides in the vehicle or not may be determined based on whether the door is opened, the ignition switch is operated, settings of the air conditioner are changed, or the like. It should be taken into account that the departure itself may be cancelled. Therefore, pre-ride air conditioning is also ended when the driver does not ride in the vehicle after a predetermined time from the scheduled departure time, so as to prevent the battery from being excessively discharged.

After pre-ride air conditioning is ended, controller 30 stores in step S7 an integral of discharge current. After this, in step S22, control is returned to a predetermined main routine.

In contrast, when it is determined in step S1 that pre-ride air conditioning is not to be carried out, the process proceeds from step S1 to step S8. In step S8, it is determined whether the battery is to be plug-in-charged. For example, based on whether power supply 8 is connected to charger 6 in FIG. 1, it is determined whether the battery is to be plug-in-charged.

When it is determined in step S8 that the battery is to be plug-in-charged, the process proceeds from step S8 to step S9. In step S9, it is determined whether this is plug-in charging immediately after pre-ride air conditioning.

The plug-in charging immediately after pre-ride air conditioning includes the case where plug-in charging is started within a predetermined time after pre-ride air conditioning is ended, and the case where pre-ride air conditioning is performed while vehicle is being plug-in-charged and the battery is discharged (where the air conditioning consumes greater electric power than plug-in charging power) and the plug-in charging is continued even after the pre-ride air conditioning is completed.

The energy discharged from the battery during such pre-ride air conditioning can surely be recovered by charging, if it is immediately after the pre-ride air conditioning. In the case where the SOC is estimated by the conventional method and the battery is charged, the estimated SOC is somewhat higher than actual and the battery is charged insufficiently, although it is still before the upper limit of SOC is reached in actual. Therefore, the distance over which the vehicle can travel with the electric power obtained by external charging is shortened.

In the present embodiment, the integral of discharged current (Ah: ampere-hour) is calculated, and the battery is charged with the same amount as the discharged amount. Therefore, the SOC of the battery before discharged can be surely recovered. In other words, there is no risk of overcharging of the battery even when the battery is charged with the same amount of electric current as the amount of discharged current. The battery can be charged with the same amount of electric current as the amount of discharged electric current, by using the same SOC estimation method for pre-ride air conditioning and plug-in charging, namely by integration of electric current only.

When it is determined in step S9 that the battery is to be plug-in-charged immediately after pre-ride air conditioning, a series of operations for plug-in charging shown in step S40 is performed. This determination may be made for example by storing the time when air conditioning in step S6 is completed and based on the fact that a predetermined time has not elapsed from the stored time.

First, in step S10, controller 30 is configured to use the value stored in step S3 for pre-ride air conditioning, for correcting the value of electric current detected by the current sensor. This is for the reasons that the offset correction value can be used as it is because it is immediately after the pre-ride air conditioning and that, if the offset correction value is changed, the charge amount could be different from the required amount, although the battery has to be charged accurately by the amount corresponding to the discharge amount. As for the initial value of the SOC, the SOC at the time when the preceding step, namely S30 is ended is used as it is. This is for the reason that the battery is still influenced by the polarization when it is immediately after discharging, and therefore an error is generated if the open-circuit voltage is measured to obtain the SOC on the map in FIG. 2.

Subsequently, in step S11, controller 30 is configured to use the electric current integration method as a method of calculating the state of charge SOC. At this time, the value of electric current detected by the current sensor is corrected by using the offset value stored in step S3 and is used for the integration. After this, in the state where the SOC is calculated by this calculation method, plug-in charging is performed in step S12. The SOC is calculated by using the same method and the same offset value as those used for pre-ride air conditioning, and thus the battery can be charged with the amount corresponding to the integral of discharged electric current when pre-ride air conditioning is performed.

In this way, for a preprocess of a series of operations for pre-ride air conditioning in step S30, a post-process of a series of operations for plug-in charging in step S40 is completed.

In contrast, when it is determined in step S9 that plug-in charging is not immediately after pre-ride air conditioning, the process proceeds to step S13 and a normal plug-in charging process is performed.

A description will be given of an example where battery B1 is to be plug-in charged. In step S13, zero current control similar to step S2 is performed. In step S14, controller 30 stores a value detected by current sensor 11-1 as an offset value. This offset value is stored in a nonvolatile memory or the like in controller 30.

At this time, because the current is zero, open-circuit voltage OCV can be measured. Controller 30 thus measures open-circuit voltage OCV using voltage sensor 10-1 in step S15. Then, based on open-circuit voltage OCV measured at this time, the map in which the correlation shown in FIG. 2 is stored is used to obtain the initial value of state of charge SOC.

Subsequently, in step S16, controller 30 is configured to use the electric current integration method as a method of calculating the state of charge SOC. The value of electric current detected by the current sensor at this time is corrected by using the offset value stored in step S14 and is used for the integration. After this, in the state where the SOC is calculated by this calculation method, plug-in charging is performed in step S17.

Plug-in charging is ended when charging proceeds and the SOC reaches the upper control limit or a plug is pulled out and connection with an external power supply is severed, for example.

Next, a description will be given of SOC estimation that is performed not for plug-in charging and pre-ride air conditioning but for normal travel of the vehicle. When it is determined in step S8 that plug-in charging is not performed, the process proceeds to step S18. For example, when power supply 8 is not connected to charger 6 in FIG. 1, controller 30 recognizes that plug-in charging is not to be performed.

In step S18, controller 30 sets the circuit state by opening system main relays SMR1, SMR2 so that battery currents Ib1, Ib2 are zero. In step S19, controller 30 stores values detected by current sensors 11-1, 11-2 as offset values. The offset values are stored in a nonvolatile memory or the like in controller 30.

Subsequently, in step S20, controller 30 is configured to use, as a method of calculating the SOC, an estimation method (herein referred to as OCV estimation method) different from steps S5, S11, and S16 to calculate the SOC. This OCV estimation method prevents integration of errors, besides integration of electric current, in the case where the battery is used in such a manner that the battery is frequently and repeatedly charged and discharged on which the battery voltage and the battery internal resistance are reflected.

Then, in step S21, charging and discharging control for normal travel is performed. In this case, the power running mode and the regenerative mode of the motor are controlled and the engine as well as power generation by the generator are controlled so that an estimated SOC is always between the upper control limit and the lower control limit of the SOC of the battery that are determined in terms of the battery life. When the ignition switch is turned off, the estimated SOC value of the battery at this time is stored in the nonvolatile memory. The stored estimated value may be used as the initial value of the next SOC.

When any of the operations in step S7, S12, S17, and S21 is completed, the process proceeds to step S22 and the control returns to the main routine.

As heretofore described, when it has been known that only one of charging and discharging is performed, controller 30 integrates charge or discharge current and adds it to the initial value of the SOC to estimate the SOC in steps S5, S11, and S16. In contrast, in the case where a charging cycle and a discharging cycle are frequently repeated like the case in which the vehicle travels in normal manner, the OCV estimation method that is a different estimation method is used in step S20. The OCV estimation method prevents integration of errors, besides integration of electric current, in the case where the battery is used in such a manner that the battery is frequently and repeatedly charged and discharged on which the battery voltage and the battery internal resistance are reflected.

Such a switch of the SOC estimation process made by controller 30 will be described by means of a block diagram.

Figure 5:
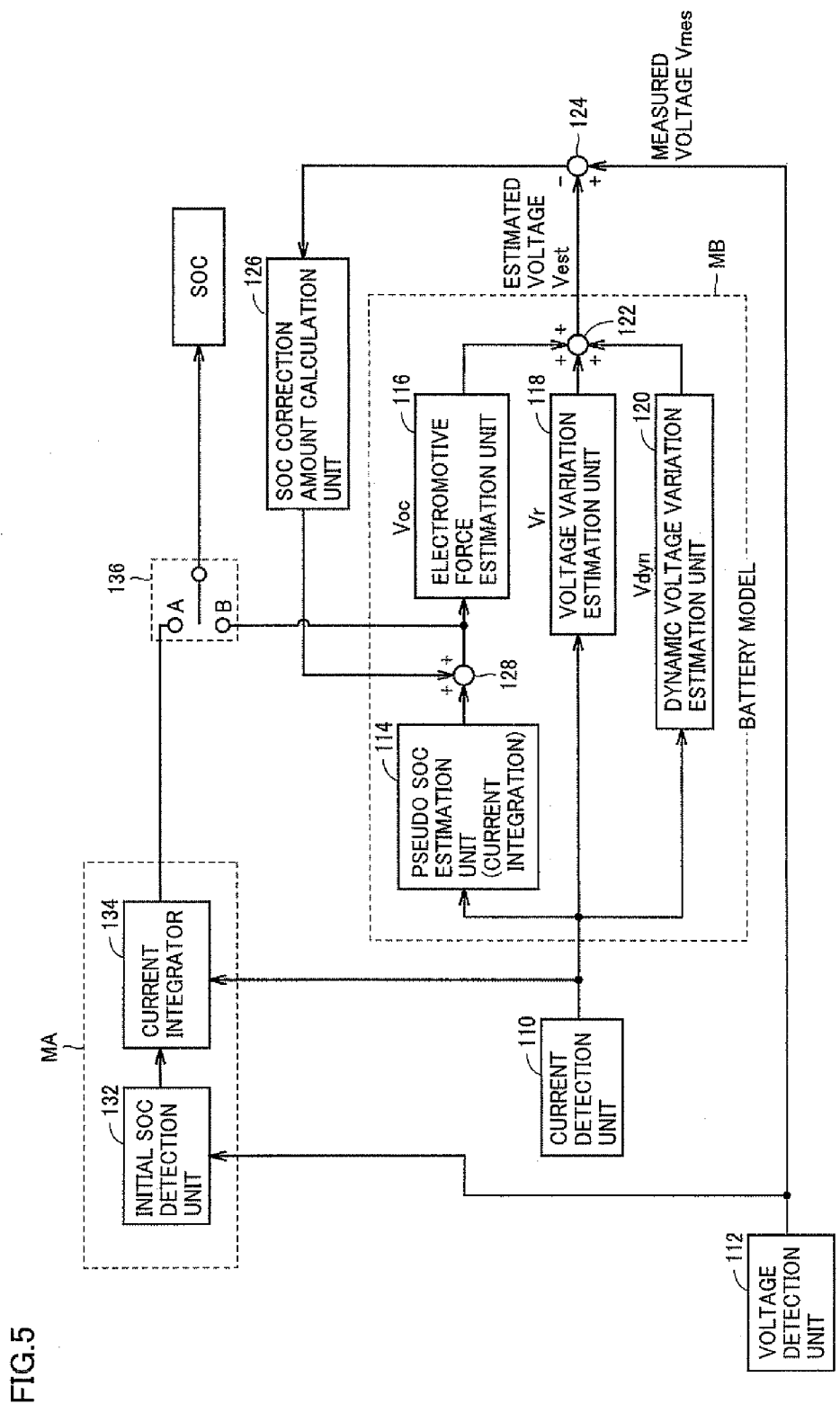
FIG. 5 is a block diagram showing a configuration for an SOC estimation process performed by a controller 30.

FIG. 5 is the block diagram showing a configuration for an SOC estimation process performed by controller 30.

Referring to FIG. 5, the battery charge/discharge current is detected by a current detection unit 110. The battery voltage at this time is detected by a voltage detection unit 112. Current detection unit 110 corresponds to current sensors 11-1, 11-2 in FIG. 1. Voltage detection unit 112 corresponds to voltage sensors 10-1, 10-2 in FIG. 1.

While the vehicle is traveling normally, the SOC is estimated by means of a battery model MB. Selection setting of a selection unit 136 is set at B so that a value of the SOC estimated by means of battery model MB is used. The charge/discharge current value detected by current detection unit 110 is integrated by a pseudo SOC estimation unit 114, added to an initial value of the battery SOC determined in advance, so as to estimate a pseudo SOC that is a temporary value of the SOC. The initial value of the SOC is 100% when the battery is fully charged. Alternatively, an estimated value of the SOC stored in a nonvolatile memory in controller 30 when previous use of the vehicle was ended may be read and used.

Based on the pseudo SOC determined in this manner, an electromotive force estimation unit 116 estimates a battery voltage corresponding to this pseudo SOC. The battery voltage estimated by this electromotive force estimation unit 116 is an estimated value Voc of the open-circuit voltage of the battery. For such open-circuit voltage Voc, for example, a map for the SOC and the open-circuit voltage as shown in FIG. 2 may be determined for each battery in advance, and open-circuit voltage Voc may be estimated that corresponds to the pseudo SOC provided from pseudo SOC estimation unit 114.

Further, from the battery charge/discharge current value detected by current detection unit 110, a voltage variation estimation unit 118 estimates a voltage variation due to the internal resistance of the battery. Voltage variation estimation unit 118 estimates a variation of the battery voltage due to the internal resistance, based on the following equation:

$$Vr = -r \times Ib$$

where r represents internal resistance and Ib represents battery current value (discharge is represented by positive). Vr represents a voltage variation due to the internal resistance estimated by voltage variation estimation unit 118. Internal resistance r of the battery is determined in advance for each battery. Current value Ib is the charge/discharge current value detected by current detection unit 110. This voltage variation Vr corresponds to $\Delta V1$ in FIG. 3.

Further, a dynamic voltage variation estimation unit 120 estimates a variation of the battery voltage based on a change in charge/discharge current of the battery. This dynamic voltage variation is caused by the polarization of the battery. Dynamic voltage variation estimation unit 120 provides a dynamic voltage variation Vdyn of the battery that is determined based on a pattern of use in which the battery is frequently and repeatedly charged and discharged. This voltage variation Vdyn corresponds to $\Delta V2$ in FIG. 3. For example, a polarization voltage at a set time for the traveling vehicle for battery current Ib is measured in advance, and voltage variation Vdyn may be defined in the form of a map with respect to the electric current and used.

Next, the sum of respective output values of above-described electromotive force estimation unit 116, voltage variation estimation unit 118, and dynamic voltage variation estimation unit 120 is calculated by an adder 122 to determine an estimated voltage Vest that is an estimated value of the battery voltage, namely Vest=Voc+Vr+Vdyn is determined.

Above-described pseudo SOC estimation unit 114, electromotive force estimation unit 116, voltage variation estimation unit 118, dynamic voltage variation estimation unit 120, and adder 122 constitute battery model MB.

Estimated voltage Vest of the battery that is estimated by battery model MB as described above is compared by a comparator 124 with actually measured voltage Vmes of the battery that is detected by voltage detection unit 112, and a difference therebetween is input to an SOC correction amount calculation unit 126. SOC correction amount calculation unit 126 and adder 128 solve the following equation to determine an estimated value of the battery SOC:

$$SOC = SOCp + Kp \times (Vmes - Vest) + Ki \times \int (Vmes - Vest)dt$$

where SOCp represents pseudo SOC and Kp and Ki represent coefficients. In the equation above, the pseudo SOC (SOCp) is the output value of pseudo SOC estimation unit 114. Further, SOC correction amount calculation unit 126 calculates the second and third terms in the above equation, namely a component proportional to the difference (Vmes−Vest) between estimated voltage Vest and measured voltage Vmes determined by comparator 124, and a component proportional to the integral of the difference. Here, coefficients Kp and Ki are determined in advance from battery characteristics. The above components calculated by SOC correction amount calculation unit 126 are added by adder 128 to output value SOCp of pseudo SOC estimation unit 114 as shown by the above equation. In this way, the estimated value of the battery SOC can be obtained.

As seen from above, for a vehicle traveling normally, battery model MB is used to estimate the electromotive force of the battery from the pseudo SOC. Further, a variation due to the internal resistance of the battery voltage, and a dynamic voltage variation due to a change in charge/discharge current are estimated. The battery voltage is estimated by calculating the sum of them. Namely, the battery model is used to estimate battery voltage Vest in consideration of the pseudo SOC and the variation of the state of the battery. Next, the pseudo SOC is corrected so that this estimated voltage Vest is equal to actually measured battery voltage Vines, so as to estimate the SOC of the battery.

In this way, battery model MB which is used when the vehicle is traveling is used to correct the pseudo SOC so that estimated voltage Vest and actually measured battery voltage Vmes are equal to each other. Therefore, even if the initial value of the SOC which is provided first includes a large error, it can immediately converge to the accurate estimated value of the SOC.

In the case where it is known that only one of charging and discharging is to be performed, for example, where plug-in charging or pre-ride air conditioning is to be performed, the SOC is estimated by means of a battery model MA. Selection setting of selection unit 136 is thus set at A so that the estimated value of the SOC by means of battery model MA is used.

In battery model MA, an initial SOC detection unit 132 determines an initial SOC based on the battery voltage detected by voltage detection unit 112. As explained above with reference to FIG. 3, when it is immediately after charging or discharging is stopped, the influence of the polarization still remains. Therefore, the SOC having been estimated by battery model MA, MB for example is used as it is. When a certain time in which current is substantially zero has elapsed since charging or discharging is stopped, the SOC is determined from the map shown in FIG. 2, because battery voltage VB that was measured when the zero current control was performed is equal to the electromotive force of the battery.

Then, the charge/discharge current value detected by current detection unit 110 is integrated by a current integrator 134, the integral is added to the initial value of the battery SOC determined by initial SOC detection unit 132, and the SOC is estimated.

In the case where plug-in charging or pre-ride air conditioning is performed far example, only one of charging and discharging is performed and large current such as motor current while the vehicle is traveling does not flow. Therefore, an estimation error of the SOC is not likely to accumulate, and such a current integration method may be used to estimate the SOC. Thus, there is no influence of an increased voltage variation due to the polarization, and the vehicle can be accurately plug-in charged to the upper control limit of the SOC. Further, the electric power of the battery having been used for pre-ride air conditioning can also be recovered surely by plug-in charging. This is advantageous in that the distance over which the vehicle travels continuously in the EV mode can be extended.

When plug-in charging or pre-ride air conditioning is performed, only one of charging and discharging is performed, and a large current such as motor current while the vehicle is traveling does not flow. Therefore, current detection unit 110 in FIG. 5 may be divided into detection units of different ranges such as current detection units 110A, 110B. Then, a switch may be made between use of current detection unit 110A and use of current detection unit 110B in response to setting of selection of selection unit 136, in such a manner that current detection unit 110A of a smaller measurement range and higher resolution is used when battery model MA is used, and current detection unit 110B having a measurement range with which large current can be measured, and having lower resolution may be used when battery model MB is used. In the case of FIG. 1, instead of current sensors 11-1, 11-2, sensors 11-1A, 11-2A of higher precision and sensors 11-1B, 11-2B of a lower precision while capable of measuring larger current may be provided at the same locations and used as appropriate. In this way, the SOC can be estimated more accurately.

FIG. 6 is a waveform diagram for illustrating an example of the case where plug-in charging is performed immediately after pre-ride air conditioning, based on an SOC calculation process in the present embodiment.

Referring to FIG. 6, it is supported that plug-in charging has already been performed at time t11, and the state of charge SOC of the battery has reached upper control limit Smax. In response to the fact that it is the time set in advance, pre-ride air conditioning is started at time t11. At this time, battery current IB is discharge current.

From time t11 to time t12, pre-ride air conditioning is carried out. In this period, as the battery is discharged, the SOC decreases. Then, battery current IB is integrated. Based on the resultant value of the battery current, the SOC is estimated. No one has ridden in the vehicle even after a predetermined time from a scheduled departure time. Therefore, pre-ride air conditioning is ended at time t12. Preferably, when pre-ride air conditioning is ended, the integral k (Ah) of battery current IB discharged from the time when the battery is charged to upper control limit Smax of the SOC may be stored.

The above-described process corresponds to execution of operations from step S1 to steps S2 to S7 in FIG. 4.

From time t12 to time t13, the battery current remains zero. After this, if the vehicle does not travel and an external power supply is kept connected to the charger, charging is started at time t13 so that the discharged current is recovered by charging.

From time t13 to time t14, plug-in charging is carried out. In this period, as the battery is charged, the SOC increases. Then, battery current IB is integrated and, based on the resultant integral of the battery current, the SOC is estimated. When the SOC has reached the original upper control limit Smax, plug-in charging is ended. Instead, preferably, based on the integral, it may be determined whether the battery has been charged by the amount corresponding to stored integral k (Ah) of battery current IB.

The above-described process corresponds to execution of operations from step S1 to steps S10 to S12. At this time, the offset value of the current sensors as used is the same value as that used for discharging and accordingly the current value is corrected. Therefore, an error of the integral due to a different offset value is prevented. Further, when the battery is plug-in charged, the battery can be accurately charged to the upper control limit of the SOC. Therefore, the distance over which the vehicle can continuously travel in the EV mode can be extended.

Finally, referring to FIG. 1, a general description of the present embodiment will be given. Vehicle 1 includes a chargeable and dischargeable secondary battery (B1, B2), a current sensor (11-1, 11-2) for detecting electric current of the secondary battery, and controller 30 for estimating a state of charge (SOC) of the secondary battery and controlling charging and discharging of the secondary battery based on the state of charge. In a first operation mode in which a charging cycle and a discharging cycle are repeated, controller 30 estimates an open-circuit voltage (OCV) of the secondary battery and determines the state of charge (SOC) based on a value obtained by correcting the open-circuit voltage based on polarization. In a second operation mode in which one of charging and discharging is continued, controller 30 determines the state of charge (SOC) based on a result of integration of the electric current detected by the current sensor (11-1, 11-2).

Preferably, vehicle 1 is mounted with charger 6 connectable to the external power supply in FIG. 1, and configured to be able to undergo external charging by which the secondary battery (battery B1, B2) is charged from a source external to the vehicle. The second operation mode is selected when the external charging is performed.

More preferably, vehicle 1 further includes an air conditioning apparatus (air conditioner 7) capable of executing pre-ride air conditioning using electric power supplied from the secondary battery (battery B1, B2). The second operation mode is selected when the external charging is performed and when the pre-ride air conditioning is performed. When one of the external charging and the pre-ride air conditioning is executed as a preprocess and the other is executed as a post-process performed subsequently to the preprocess, controller 30 stores an offset value of the current sensor before the preprocess is executed and, when the post-process is executed, controller 30 uses the offset value stored before the preprocess is executed, to correct the electric current detected by the current sensor.

Preferably, vehicle 1 further includes an electric motor (motor generator MG1, MG2) capable of executing a power-running operation and a regenerative operation. The first operation mode is selected when the vehicle travels in such a manner that the power-running operation and the regenerative operation can be repeated.

Further, as shown in FIG. 4, the present invention in another aspect is a method of estimating a state of charge of a secondary battery (B1, B2) that is chargeable and dischargeable, including the steps of: determining an operation mode in which the secondary battery is used (S1, S8, S9); determining the state of charge by estimating an open-circuit voltage of the secondary battery and based on a value obtained by correcting the open-circuit voltage based on polarization, when the step of determining an operation mode (S1, S8, S9) determines that the operation mode is a first operation mode (NO in step S1, NO in step S8) in which a charging cycle and a discharging cycle are repeated (S20); and determining the state of charge based on a result of integration of the electric current detected by the current sensor, when the step of determining an operation mode (S1, S8, S9) determines that the operation mode is a second operation mode (YES in step S1 or YES in step S8) in which one of charging and discharging is continued (step S5, S11, S16).

Preferably, the secondary battery (battery B1, B2) is mounted on vehicle 1. Vehicle 1 is configured to be able to undergo external charging by which the secondary battery (battery B1, B2) is charged from a source (8) external to the vehicle. The step of determining an operation mode determines that the operation mode is the second operation mode when the external charging is performed.

More preferably, the vehicle further includes an air conditioning apparatus (air conditioner 7) capable of executing pre-ride air conditioning using electric power supplied from the secondary battery. The second operation mode is selected when the external charging is performed and when the pre-ride air conditioning is performed. The method further includes the step of storing, when one of the external charging (S40) and the pre-ride air conditioning (S30) is executed as a preprocess and the other is executed as a post-process performed subsequently to the preprocess, an offset value of the current sensor before the preprocess is executed and, when the post-process is executed, using the offset value stored before the preprocess is executed, to correct the electric current detected by the current sensor.

While the description of FIG. 4 has been given in which the pre-ride air conditioning (S30) is a preprocess and the external charging is a post-process (S40), the pre-ride air conditioning and the external charging may be a post-process and a preprocess, respectively. In this case, when the external charging is performed, the offset value of the current sensor and the initial SOC are obtained and stored instead of step S10 and, when the pre-ride air conditioning is performed, the offset value stored when the external charging is performed is used instead of the offset value stored in step S3, and the SOC estimated when the external charging is completed is used as it is.

Preferably, the vehicle further includes an electric motor (motor generator MG1, MG2) capable of executing a power-running operation and a regenerative operation. The step of determining an operation mode determines that the operation mode is the first operation mode when the vehicle is traveling in such a manner that the power-running operation and the regenerative operation can be repeated.

It should be construed that embodiments disclosed herein are by way of illustration in all respects, not by way of limitation. It is intended that the scope of the present invention is defined by claims, not by the above description, and includes all modifications and variations equivalent in meaning and scope to the claims.

The invention claimed is:

1. A vehicle comprising:
   a chargeable and dischargeable secondary battery;
   a current sensor for detecting electric current of said secondary battery; and
   a controller for estimating a state of charge of said secondary battery and controlling charging and discharging of said secondary battery based on said state of charge,
   in a first operation mode in which a charging cycle and a discharging cycle are repeated, said controller estimating the state of charge of said secondary battery by a first estimation method of estimating an open circuit voltage of said secondary battery and determining said state of charge based on a value obtained by correcting said open circuit voltage based on polarization, and
   in a second operation mode in which one of charging and discharging is continued, said controller estimating the state of charge of said secondary battery by a second estimation method different from said first estimation method,
   following said second estimation method, said controller determining said state of charge based on a result of integration of the electric current detected by said current sensor,
   said vehicle being configured to be able to perform external charging by which said secondary battery is charged from a source external to the vehicle,
   said second operation mode being selected when said external charging is performed,
   said vehicle further comprising an air conditioning apparatus capable of executing pre-ride air conditioning using electric power supplied from said secondary battery,
   said second operation mode being selected when said external charging is performed and when said pre-ride air conditioning is performed, and
   when one of said external charging and said pre-ride air conditioning is executed as a preprocess and the other of said external charging and said pre-ride air conditioning is executed as a post-process performed subsequently to said preprocess, said controller storing an offset value of said current sensor before said preprocess is executed and, when said post-process is executed, said controller using said offset value stored before said preprocess is executed, to correct the electric current detected by said current sensor.

2. The vehicle according to claim 1, further comprising an electric motor capable of executing a power-running operation and a regenerative operation, wherein
   said first operation mode is selected when the vehicle travels in such a manner that said power-running operation and said regenerative operation can be repeated.

3. A method of estimating a state of charge of a secondary battery that is chargeable and dischargeable, comprising the steps of:
   determining an operation mode in which said secondary battery is used;
   estimating the state of charge of said secondary battery by a first estimation method of estimating an open circuit voltage of said secondary battery and determining said state of charge based on a value obtained by correcting said open circuit voltage based on polarization, when said step of determining an operation mode determines that said operation mode is a first operation mode in which a charging cycle and a discharging cycle are repeated; and
   estimating the state of charge of said secondary battery by a second estimation method different from said first estimation method, determining said state of charge based on a result of integration of electric current detected by the current sensor, when said step of determining an operation mode determines that said operation mode is a second operation mode in which one of charging and discharging is continued,
   said second estimation method determining said state of charge based on a result of integration of electric current detected by the current sensor,
   said secondary battery being mounted on a vehicle,
   said vehicle being configured to be able to perform external charging by which said secondary battery is charged from a source external to the vehicle,
   said step of determining an operation mode determining that the operation mode is said second operation mode when said external charging is performed,
   said vehicle further including an air conditioning apparatus capable of executing pre-ride air conditioning using electric power supplied from said secondary battery,
   said second operation mode being selected when said external charging is performed and when said pre-ride air conditioning is performed, and
   said method further comprising the step of storing, when one of said external charging and said pre-ride air conditioning is executed as a preprocess and the other of said external charging and said pre-ride air conditioning is executed as a post-process performed subsequently to said preprocess, an offset value of said current sensor before said preprocess is executed and, when said post-process is executed, using said offset value stored before said preprocess is executed, to correct the electric current detected by said current sensor.

4. The method of estimating a state of charge of a secondary battery according to claim 3, wherein
   said vehicle further includes an electric motor capable of executing a power-running operation and a regenerative operation, and
   said step of determining an operation mode determines that the operation mode is said first operation mode when the vehicle is traveling in such a manner that said power-running operation and said regenerative operation can be repeated.

5. A vehicle comprising:
   a secondary battery configured to be capable of being charged from a source external to the vehicle;
   a current sensor for detecting electric current of said secondary battery;
   an air conditioning apparatus capable of executing pre-ride air conditioning using electric power supplied from said secondary battery; and
   a controller receiving an output of said current sensor for controlling charging and discharging of said secondary battery,
   when said secondary battery is discharged and said pre-ride air conditioning is executed, said controller calculating an amount of discharge current by integrating the discharge current and, when said secondary battery is charged from a source external to the vehicle immediately after said pre-ride air conditioning is ended, said controller performing control by calculating an integral of charge current so that said secondary battery is charged with the charge current of the integral equal to said calculated amount of discharge current.

6. A method of controlling a vehicle,
said vehicle including:
a secondary battery configured to be capable of being charged from a source external to the vehicle;
a current sensor for detecting electric current of said secondary battery; and
an air conditioning apparatus capable of executing pre-ride air conditioning using electric power supplied from said secondary battery,
said method comprising the steps of:
calculating, when said secondary battery is discharged and said pre-ride air conditioning is executed, an amount of discharge current by integrating discharge current detected by said current sensor; and
calculating, when said secondary battery is charged from a source external to the vehicle immediately after said pre-ride air conditioning is ended, an integral of charge current detected by said current sensor so that said secondary battery is charged with the charge current of the integral equal to said calculated amount of discharge current.

* * * * *